United States Patent
Philipp (10) Patent No.: US 7,571,901 B2
(45) Date of Patent: Aug. 11, 2009

(54) CIRCUIT FOR PROGRAMMING A MEMORY ELEMENT

(75) Inventor: Jan Boris Philipp, Peekskill, NY (US)

(73) Assignee: Qimonda North America Corp., Cary, NC (US)

( * ) Notice: Subject to any disclaimer, the term of this patent is extended or adjusted under 35 U.S.C. 154(b) by 239 days.

(21) Appl. No.: 11/766,201

(22) Filed: Jun. 21, 2007

(65) Prior Publication Data

US 2008/0316792 A1    Dec. 25, 2008

(51) Int. Cl.
*G11C 11/00* (2006.01)
(52) U.S. Cl. .............. 365/163; 365/185.18; 365/185.19
(58) Field of Classification Search ................. 365/163, 365/185.18, 189.07, 185.19
See application file for complete search history.

(56) References Cited

U.S. PATENT DOCUMENTS

| | | | |
|---|---|---|---|
| 6,075,719 A | 6/2000 | Lowrey et al. | |
| 6,687,153 B2 | 2/2004 | Lowrey | |
| 6,759,267 B2 | 7/2004 | Chen | |
| 7,031,181 B1 | 4/2006 | Happ | |
| 7,099,180 B1 | 8/2006 | Dodge et al. | |
| 7,110,286 B2 | 9/2006 | Choi et al. | |
| 7,113,424 B2 | 9/2006 | Happ et al. | |
| 7,154,774 B2 * | 12/2006 | Bedeschi et al. | ............ 365/163 |
| 7,180,771 B2 | 2/2007 | Cho et al. | |
| 2004/0246804 A1 | 12/2004 | Cho et al. | |
| 2004/0246808 A1 | 12/2004 | Cho et al. | |
| 2005/0117387 A1 | 6/2005 | Hwang et al. | |
| 2005/0117388 A1 | 6/2005 | Cho et al. | |
| 2005/0195633 A1 | 9/2005 | Choi et al. | |
| 2006/0126380 A1 | 6/2006 | Osada et al. | |
| 2006/0220071 A1 | 10/2006 | Kang et al. | |
| 2007/0077699 A1 | 4/2007 | Gordon et al. | |

OTHER PUBLICATIONS

"Intel StrataFlash Memory Technology Overview", Greg Atwood, et al., Intel Technology Journal Q4, 1997 (8 pgs.).
"Characteristics of OUM Phase Change Materials and Devices for High Density Nonvolatile Commodity and Embedded Memory Applications", Tyler A. Lowrey, et al., Ovonyx, Inc., 2004 (7 pgs.).

(Continued)

*Primary Examiner*—Son Dinh
(74) *Attorney, Agent, or Firm*—Dicke, Billig & Czaja, PLLC (57) ABSTRACT

An integrated circuit includes a memory element and a circuit. The circuit is configured to program the memory element by applying one or more pulses to the memory element until a sensed resistance of the memory element is within a range of a desired resistance. The one or more pulses have a parameter value that is modified for each subsequent pulse based on the parameter value for an immediately preceding pulse and on a difference between the sensed resistance of the memory element and the desired resistance.

35 Claims, 9 Drawing Sheets

OTHER PUBLICATIONS

"OUM, Ovonic Unified Memory", ECD Ovonics, Research Report, http://www.ovonics.com/PDFs/Elec_Memory_Research_Report/OUM.pdf, 1999 (80 pgs.).

"Enhanced Write Performance of a 64 Mb Phase-change Random Access Memory", Hyung-rok Oh, et al., IEEE International Solid-State Circuit Conference, 2005 (3 pgs.).

"A Nonvolatile Programmable Solid Electrolyte Nanometer Switch", T. Sakamoto, et al., IEEE International Solid-State Circuits Conference, 2004 (10 pgs.).

"OUM—A 180 nm Nonvolatile Memory Cell Element Technology for Stand Alone and Embedded Applications", Stefan Lai, et al., Intel Corporation, (4 pgs.).

"An Edge Contact Type Cell for Phase Change RAM Featuring Very Low Power Consumption", Y.H. Ha, et al., Symposium on VLSI Technology Digest of Technical Papers, 2003, (2 pgs.).

"A Novel Cell Technology Using N-doped GeSbTe Films for Phase Change RAM", H. Horii, et al., Samsung Electronics., 2003 (2 pgs.).

\* cited by examiner

CIRCUIT FOR PROGRAMMING A MEMORY ELEMENT

CROSS-REFERENCE TO RELATED APPLICATIONS

This application is related to U.S. patent application Ser. No. 11/204,201 entitled "INTEGRATED CIRCUIT HAVING RESISTIVE MEMORY," filed Aug. 15, 2005; U.S. patent application Ser. No. 11/450,605 entitled "INTEGRATED CIRCUIT HAVING A PRECHARGING CIRCUIT," filed Jun. 9, 2006; and U.S. patent application Ser. No. 11/742,090 entitled "CIRCUIT FOR PROGRAMMING A MEMORY ELEMENT," filed Apr. 30, 2007, which are incorporated herein by reference.

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of-phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on.

To program a phase change memory cell to an intermediate resistance value, the amount of crystalline material coexisting with amorphous material and hence the cell resistance is controlled via a suitable write strategy. The amount of crystalline material coexisting with amorphous material should be precisely controlled to ensure consistent resistance values for multi-bit storage. Consistent resistance values having a narrow distribution of the different resistance levels ensure that a sufficient sensing margin can be obtained.

For these and other reasons, there is a need for the present invention.

SUMMARY

One embodiment provides an integrated circuit. The integrated circuit includes a memory element and a circuit. The circuit is configured to program the memory element by applying one or more pulses to the memory element until a sensed resistance of the memory element is within a range of a desired resistance. The one or more pulses have a parameter value that is modified for each subsequent pulse based on the parameter value for an immediately preceding pulse and on a difference between the sensed resistance of the memory element and the desired resistance.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
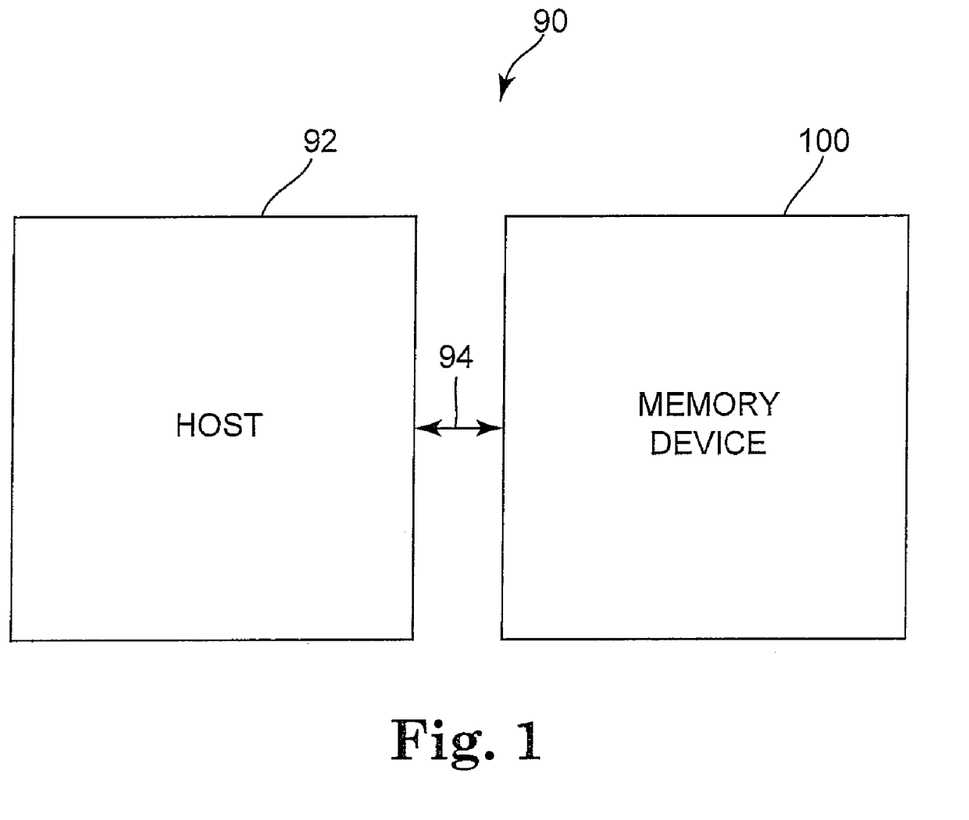
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
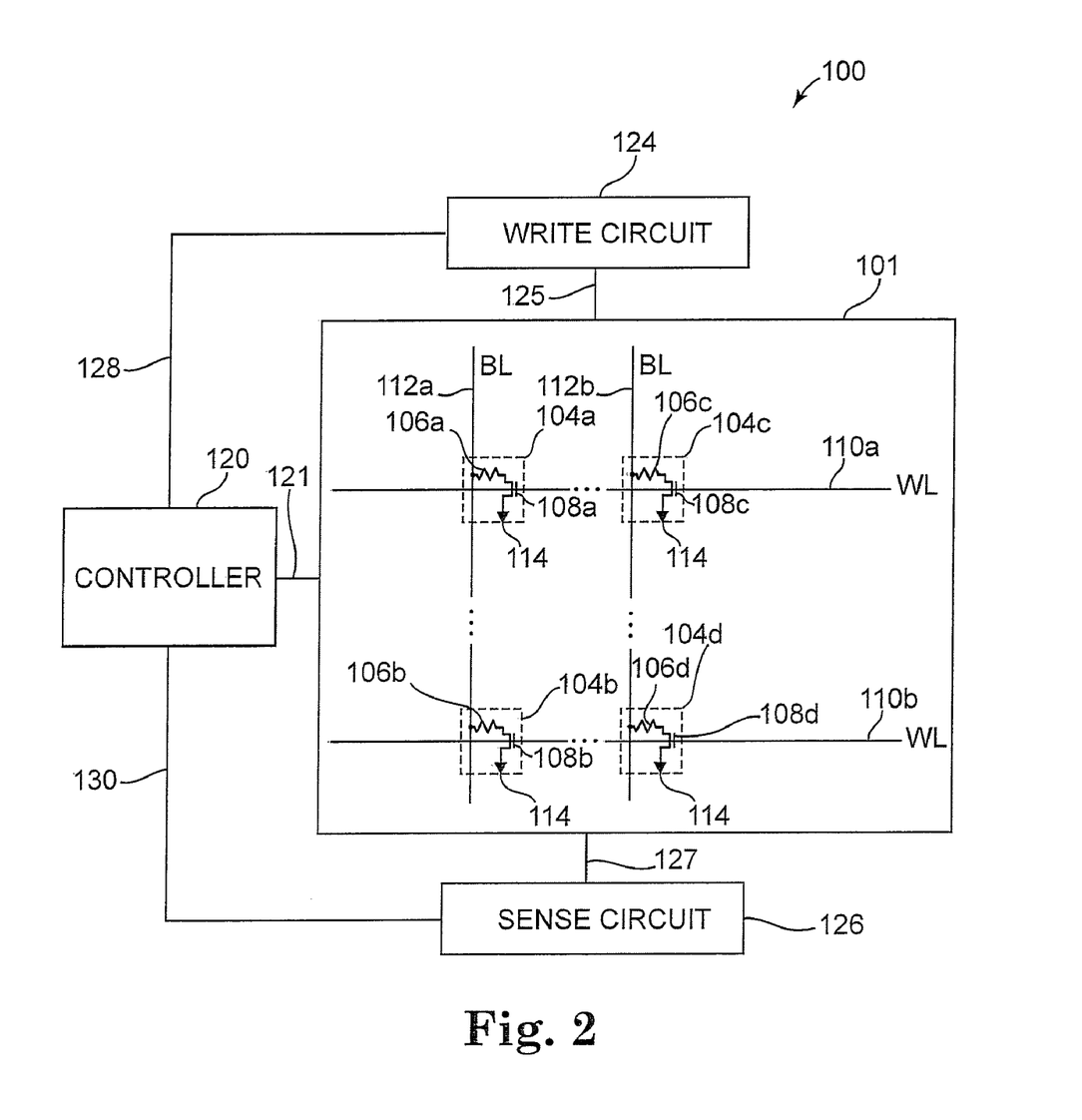
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes write circuit 124, controller 120, memory array 101, and sense circuit 126. Memory array 101 includes a plurality of phase change-memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

Write circuit 124 provides current or voltage pulses to phase change memory cells 104 to program the memory cells to a desired resistance state. To program a selected memory cell 104 to a desired resistance state, write circuit 124 applies a first write pulse including a reset portion and a first tail or set portion to the selected memory cell 104. The first tail or set portion amplitude, slope, duration, and/or other suitable parameter is selected based on the desired resistance state of the selected memory cell 104. After write circuit 124 applies the first write pulse, the resistance of the selected memory cell 104 is determined.

If the resistance of the selected memory cell 104 is within a predetermined range (e.g., +/−5% on a linear or log scale) of the desired resistance state, the programming of the selected memory cell 104 is complete. If the resistance of the selected memory cell 104 is not within the predetermined range of the desired resistance state, write circuit 124 applies a second write pulse including the reset portion and a modified second tail or set portion to the selected memory cell 104. The modified second tail or set portion amplitude, slope, duration, and/or other suitable parameter is selected based on the first tail or set portion amplitude, slope, duration, and/or other suitable parameter and on the difference between the sensed resistance of the selected memory cell 104 and the desired resistance state.

After write circuit 124 applies the second write pulse, the resistance of the selected memory cell 104 is again determined and compared to the desired resistance state. Write circuit 124 continues to apply write pulses including modified tail or set portions to the selected memory cell 104 until the resistance of the selected memory cell 104 is within the predetermined range of the desired resistance state.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. In this case, a diode and phase change element 106 is coupled in series between each cross point of word lines 110 and bit lines 112.

Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 10b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127.

In one embodiment, to read the resistance of one of the memory cells 104, sense circuit 126 provides current that flows through one of the memory cells 104. Sense circuit 126 then reads the voltage across that one of the memory cells 104. In one embodiment, sense circuit 126 provides voltage across one of the memory cells 104 and reads the current that flows through that one of the memory cells 104. In one embodiment, write circuit 124 provides voltage across one of the memory cells 104 and sense circuit 126 reads the current that flows through that one of the memory cells 104. In one embodiment, write circuit 124 provides current that flows through one of the memory cells 104 and sense circuit 126 reads the voltage across that one of the memory cells 104.

During a write operation of phase change memory cell 104a, one or more current or voltage pulses are selectively enabled by write circuit 124 and sent through bit line 112a to phase change element 106a thereby heating phase change element 106a above its melting temperature with word line 110a selected to activate transistor 108a. Depending upon the amount of time the memory element spends within the crystallization temperature range during the write pulse application, the phase change material experiences different amounts of crystallization. In this way, phase change element 106a reaches its amorphous state, crystalline state, or partially crystalline and partially amorphous state during this write operation.

The resistance of phase change element 106a is then measured to determine whether the resistance is within the desired resistance range. If the resistance of phase change element 106a is within the desired resistance range, programming of phase change element 106a is complete. If the resistance of phase change element 106a is not within the desired resistance range, one or more additional current or voltage pulses are selectively enabled by write circuit 124 and sent through bit line 112a to phase change element 106a. The additional pulse or pulses are based on the previous pulse or pulses and the difference between the measured resistance and the desired resistance. The process is repeated until the measured resistance is within the desired resistance range. Phase change memory cells 104b-104d and other phase change memory cells 104 in memory array 101 are programmed similarly to phase change memory cell 104a using a similar current or voltage pulse or pulses.

Figure 3:
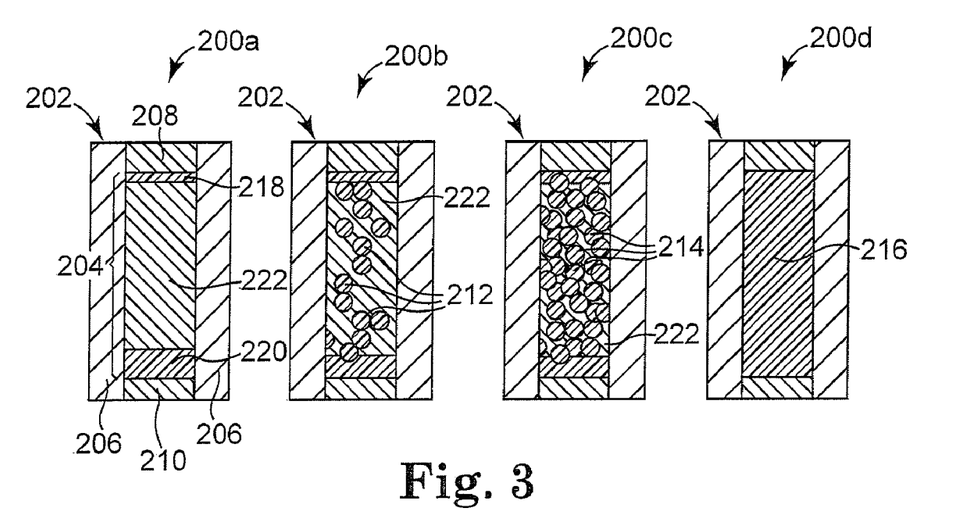
FIG. 3 is a diagram illustrating one embodiment of a phase change element in four different states.

FIG. 3 is a diagram illustrating one embodiment of a phase change element 202 in four different states at 200a, 200b, 200c, and 200d. Phase change element 202 includes a phase change material 204 that is laterally surrounded by insulation material 206. In other embodiments, phase change element 202 can have any suitable geometry including phase change material 204 in any suitable geometry and insulation material 206 in any suitable geometry.

Phase change material 204 is electrically coupled at one end to a first electrode 208 and at the other end to a second electrode 210. Pulses are provided to phase change element 202 via first electrode 208 and second electrode 210. The current path through phase change material 204 is from one of the first electrode 208 and second electrode 210 to the other one of the first electrode 208 and second electrode 210. In one embodiment, each of the phase change elements 106a-106d is similar to phase change element 202. Phase change element 202 provides a storage location for storing bits of data.

Insulation material 206 can be any suitable insulator, such as $SiO_2$, $SiO_x$, SiN, fluorinated silica glass (FSG), boro-phosphorous silicate glass (BPSG), or boro-silicate glass (BSG). First electrode 208 and second electrode 210 can be any suitable electrode material, such as TiN, TaN, W, WN, Al, C, Ti, Ta, TiSiN, TaSiN, TiAlN, TaAlN, or Cu.

Phase change material 204 is programmed into one of four states to store two bits of data. A selection device, such as an active device like a transistor 108 (FIG. 2) or diode, is coupled to first electrode 208 to control the application of pulses to phase change material 204. The pulses melt phase change material 204 and program one of the four states into phase change material 204. At 200a, a large fraction 222 of phase change material 204 has been programmed to change the resistance through phase change material 204 and phase change element 202. At 200b, a small fraction 212 of phase change material 204 has been programmed to change the resistance through phase change material 204 and phase change element 202. At 200c, a medium sized fraction 214 of phase change material 204 has been programmed to change the resistance through phase change material 204 and phase change element 202. At 200d, a large fraction 216, which is substantially all of phase change material 204, has been programmed to change the resistance through phase change material 204 and phase change element 202.

The size and state of the programmed fraction is related to the resistance through phase change material 204 and phase change element 202. The four different phase change fractions at 200a-200d provide four states in phase change material 204, and phase change element 202 provides a storage location, for storing two bits of data. In one embodiment, the state of phase change element 202 at 200a is a "00", the state of phase change element 202 at 200b is a "01", the state of phase change element 202 at 200c is a "10", and the state of phase change element 202 at 200d is a "11". In another embodiment, the state of phase change element 202 at 200a is a "11", the state of phase change element 202 at 200b is a "10", the state of phase change element 202 at 200c is a "01", and the state of phase change element 202 at 200d is a "00".

At 200a, phase change material 204 is programmed to a substantially amorphous state. During a write operation of phase change element 202, a write pulse is selectively enabled by the selection device and sent through first electrode 208 and phase change material 204. The write pulse heats phase change material 204 above its melting temperature and phase change material 204 is quickly cooled to achieve the substantially amorphous state at 200a. After the write operation, phase change material 204 includes crystalline state phase change material at 218 and 220, and amorphous state phase change material at 222. The substantially amorphous state at 200a is the highest resistance state of phase change element 202.

To program phase change material 204 into one of the other three states 200b-200d, a write pulse that melts the phase change material and includes a tail or set portion corresponding to the desired resistance state is provided via a write circuit, such as write circuit 124. The resistance of the phase change material is then sensed and compared to the desired resistance. If the sensed resistance is within a predetermined range of the desired resistance, programming of the phase change material is complete. If the sensed resistance is not within the predetermined range of the desired resistance, an additional write pulse or pulses are provided to the phase change material until the sensed resistance is within the predetermined range of the desired resistance. The additional write pulse or pulses include modified tail or set portions based on the previous tail or set portion and the difference between the sensed resistance and the desired resistance.

At 200b, a write pulse or pulses having a first tail portion or a modified first tail portion is provided to program the small volume fraction 212 into a crystalline state. The crystalline state is less resistive than the amorphous state and phase change element 202 at 200b has a lower resistance than phase change element 202 in the substantially amorphous state at 200a. The partially crystalline and partially amorphous state at 200b is the second highest resistance state of phase change element 202.

At 200c, a write pulse or pulses having a second tail portion or a modified second tail portion is provided to program the medium volume fraction 214 into a crystalline state. Since the crystalline fraction 214 is larger than the crystalline faction 212 and the crystalline state is less resistive than the amorphous state, phase change element 202 at 200c has a lower resistance than phase change element 202 at 200b and phase change element 202 in the substantially amorphous state at 200a. The partially crystalline and partially amorphous state at 200c is the second lowest resistance state of phase change element 202.

At 200d, a write pulse or pulses having a third tail portion or a modified third tail portion is provided to program substantially all of the phase change material 216 into the crystalline state. Since the crystalline state is less resistive than the amorphous state, phase change element 202 at 200d has a lower resistance than phase change element 202 at 200c, phase change element 202 at 200b, and phase change element 202 in the substantially amorphous state at 200a. The substantially crystalline state at 200d is the lowest resistance state of phase change element 202. In other embodiments, phase change element 202 can be programmed into any suitable number of resistance values or states.

Figure 4:
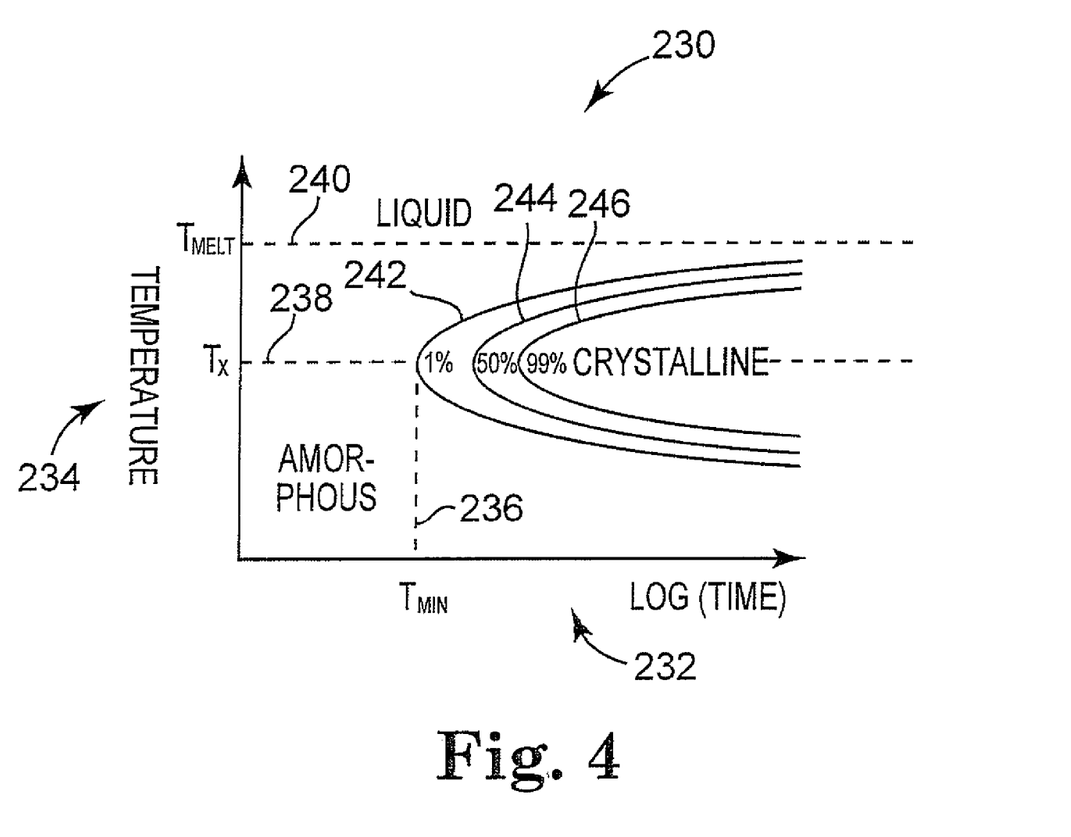
FIG. 4 is a graph illustrating one embodiment of the crystallization of phase change material based on temperature and time.

FIG. 4 is a graph 230 illustrating one embodiment of the crystallization of phase change material based on temperature and time. Graph 230 includes the log of time on x-axis 232 and temperature on y-axis 234. At a melting temperature ($T_{MELT}$) indicated at 240, the phase change material liquefies. At a crystallization temperature ($T_X$) indicated at 238 up until a minimum time ($T_{MIN}$) indicated at 236, the phase change material remains amorphous. After $T_{MIN}$ at 236, the phase change material begins to crystallize. After a first period as indicated at 242, approximately 1% of the phase change material is crystallized. After a second period as indicated at 244, approximately 50% of the phase change material is crystallized, and after a third period as indicated at 246, approximately 99% of the phase change material is crystallized. Therefore, by controlling the temperature of the phase change material over time, the amount of crystallized phase change material, and hence the resistance, can be controlled.

The log of time on x-axis 232 in FIG. 4 and in the following figures and the time on x-axis 262 and on x-axis 302 in the following figures is provided in a simplified form. The actual times will vary based on the particular phase change material and memory cell configuration selected.

Figure 5A:
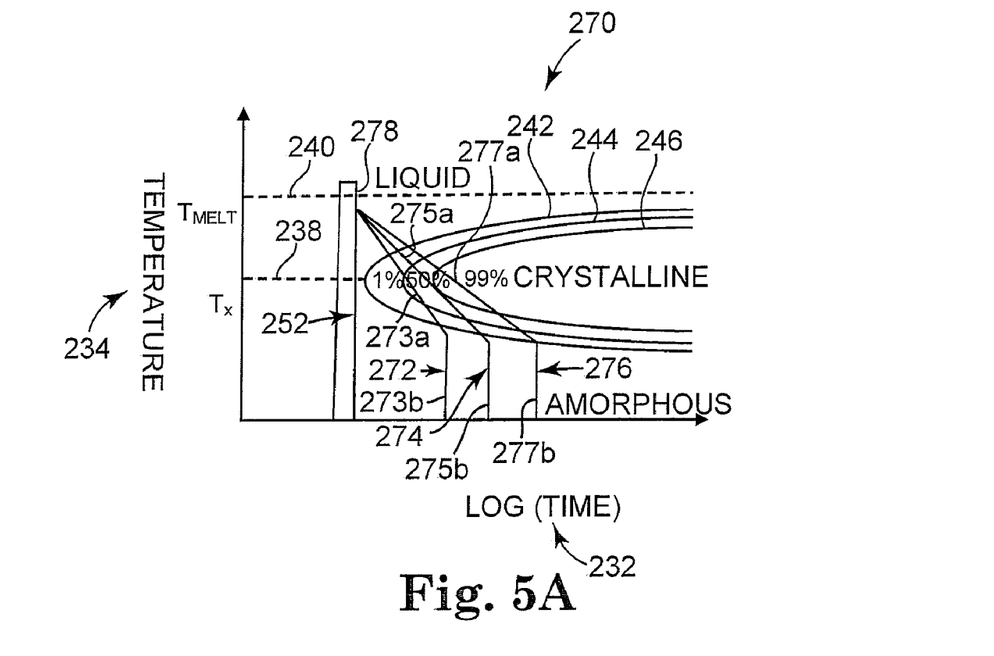
FIG. 5A is a graph illustrating one embodiment of temperature profiles for programming a phase change element to a selected one of four resistance states.

FIG. 5A is a graph 270 illustrating one embodiment of temperature profiles for programming a selected phase change element 106 to a selected one of four resistance states. Graph 270 includes a first temperature profile 252, a second temperature profile 272, a third temperature profile 274, and a fourth temperature profile 276. First temperature profile 252 quickly rises above $T_{MELT}$ 240 and then quickly falls below $T_X$ 238 to program the phase change material to the substantially amorphous state as illustrated at 200a in FIG. 3.

Second temperature profile 272 quickly rises above $T_{MELT}$ 240 and has a tail portion including a step portion 278, a gradient portion 273a that gradually ramps down to below $T_X$ 238, and a step portion 273b. Step portion 278 quickly falls from above $T_{MELT}$ 240 to below $T_{MELT}$ 240 since the phase change material does not crystallize at these temperatures. Gradient portion 273a programs the phase change material to the partially crystalline and partially amorphous state as illustrated at 200b in FIG. 3. Step portion 273b quickly reduces the temperature of the phase change material once the temperature of the phase change material falls to a temperature where no further crystallization occurs.

Third temperature profile 274 quickly rises above $T_{MELT}$ 240 and has a tail portion including step portion 278, a gradient portion 275a that gradually ramps down to below $T_X$ 238, and a step portion 275b. Gradient portion 275a programs the phase change material to the partially crystalline and partially amorphous state as illustrated at 200c in FIG. 3. Step portion 275b quickly reduces the temperature of the phase change material once the temperature of the phase change material falls to a temperature where no further crystallization occurs.

Fourth temperature profile 276 quickly rises above $T_{MELT}$ 240 and has a tail portion including step portion 278, a gradient portion 277a that gradually ramps down to below $T_X$ 238, and a step portion 277b. Gradient portion 277a programs the phase change material to the substantially crystalline state as illustrated at 200d in FIG. 3. Step portion 277b quickly reduces the temperature of the phase change material once the temperature of the phase change material falls to a temperature where no further crystallization occurs.

Gradient portion 275a of third temperature profile 274 falls below $T_X$ 238 after gradient portion 273a of second temperature profile 272 falls below $T_X$ 238. Gradient portion 277a of fourth temperature profile 276 falls below $T_X$ 238 after gradient portion 275a of third temperature profile 274 falls below $T_X$ 238. Therefore, third temperature profile 274 crystallizes more phase change material than second temperature profile 272, and fourth temperature profile 276 crystallizes more phase change material than third temperature profile 274. In this way, third temperature profile 274 programs the phase change material to a lower resistance state than second temperature profile 272, and fourth temperature profile 276 programs the phase change material to a lower resistance state than third temperature profile 274.

In other embodiments, other suitable temperature profiles can be used to program a selected phase change element 106 to a selected resistance state. For example, in one embodiment, step portion 278 and/or step portions 273b, 275b, and 277b can be excluded. In another embodiment, gradient portions 273a, 275a, and 277a can begin and/or end at different temperatures. In another embodiment, gradient portions 273a, 275a, and 277a can be approximated by a step function. In another embodiment, gradient portions 273a, 275a, and 277a can begin at different times and/or end at the same time.

Figure 5B:
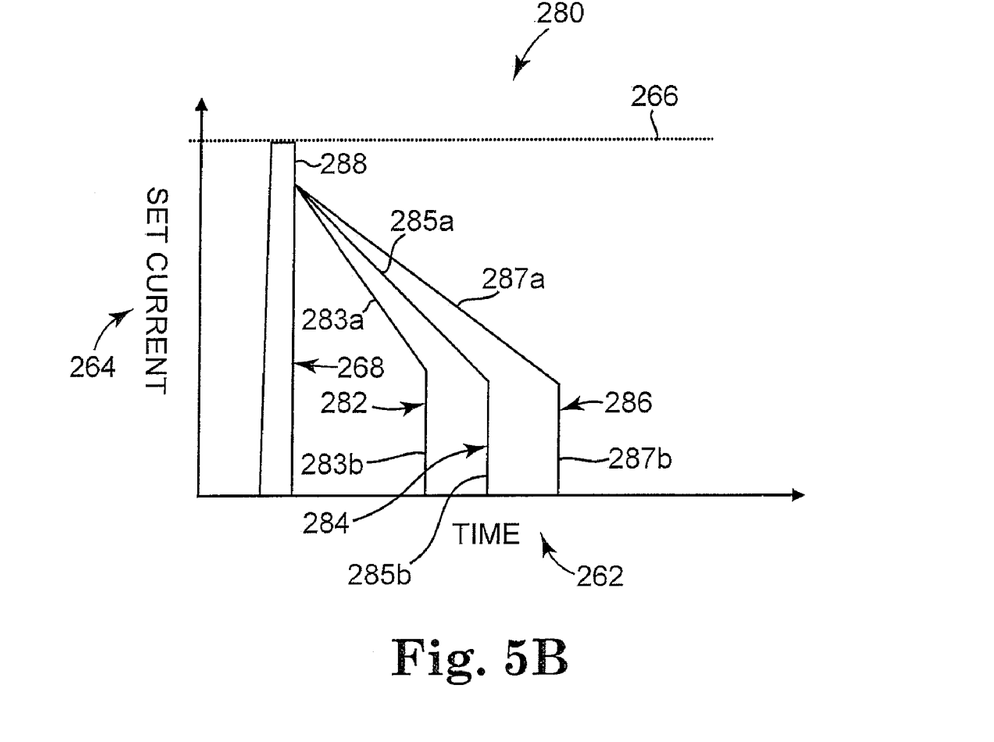
FIG. 5B is a graph illustrating one embodiment of write pulses for programming a phase change element to a selected one of four resistance states.

FIG. 5B is a graph 280 illustrating one embodiment of write pulses for programming a selected phase change element 106 to a selected one of four resistance states. Graph 280 includes time on x-axis 262 and set current on y-axis 264. Graph 280 includes a first write pulse 268, a second write pulse 282, a third write pulse 284, and a fourth write pulse 286. First write pulse 268 provides first temperature profile 252, second write pulse 282 provides second temperature profile 272, third write pulse 284 provides third temperature profile 274, and fourth write pulse 286 provides fourth temperature profile 276 as previously described and illustrated with reference to FIG. 5A. In other embodiments, other suitable write pulses for programming a selected phase change element 106 to a selected resistance state can be used to provide other suitable temperature profiles.

First write pulse 268 provides a current that rises to a reset pulse height 266, which is a current that raises the temperature of the phase change material above $T_{MELT}$ 240, and then quickly returns to zero. Second write pulse 282 provides a current that rises to reset pulse height 266 and a tail portion including a step portion 288, a gradient portion 283a, and a step portion 283b. Step portion 288 quickly reduces the current below reset pulse height 266 to provide step portion 278 of temperature profiles 272, 274, and 276 illustrated in FIG. 5A. Gradient portion 283a gradually ramps down the current to provide gradient portion 273a of second temperature profile 272 illustrated in FIG. 5A. Step portion 283b quickly reduces the current to zero to provide step portion 273b of second temperature profile 272 illustrated in FIG. 5A.

Third write pulse 284 provides a current that rises to reset pulse height 266 and a tail portion including step portion 288, a gradient portion 285a, and a step portion 285b. Gradient portion 285a gradually ramps down the current at a rate less than gradient portion 283a of second write pulse 282 to provide gradient portion 275a of third temperature profile 274 illustrated in FIG. 5A. Step portion 285b quickly reduces the current to zero to provide step portion 275b of third temperature profile 274 illustrated in FIG. 5A.

Fourth write pulse 286 provides a current that rises to reset pulse height 266 and a tail portion including step portion 288, a gradient portion 287a, and a step portion 287b. Gradient portion 287a gradually ramps down the current at a rate less than gradient portion 285a of third write pulse 284 to provide gradient portion 277a of fourth temperature profile 276 illustrated in FIG. 5A. Step portion 287b quickly reduces the current to zero to provide step portion 277b of fourth temperature profile 276 illustrated in FIG. 5A.

Gradient portions 283a, 285a, and 287a are best guess gradients for programming the selected phase change element 106 to a desired or target resistance. After applying the write pulse including the best guess gradient to the selected phase change element 106 for the target resistance, the resistance of the selected phase change element 106 is sensed and compared to the target resistance. If the sensed resistance is within a predetermined range (e.g., +/−5% on a linear or log scale or other suitable range) of the target resistance, programming of the selected phase change element 106 is complete. If the sensed resistance is not within the predetermined range of the target resistance, the gradient portion of the write pulse is modified and the write pulse is again applied to the selected phase change element 106. The gradient portion of the write pulse is modified based on the gradient portion of the previous write pulse and the difference between the sensed resistance and the target resistance. In one embodiment, the gradient portion of the write pulse is modified by increasing the duration of the gradient portion. In one embodiment, the gradient portion is modified by applying the following equation:

$$GPD(n+1)=GPD(n)+[(\log(SR)-\log(TR))*GPD(n)*GF] \quad \text{Equation I}$$

where:
GPD=gradient portion duration;
n=write pulse number;
SR=sensed resistance;
TR=target resistance; and
GF=gain factor.

In another embodiment, the gradient portion is modified by applying the following equation including a logarithmic correction:

$$GPD(n+1)= 10^{\{\log(GPD(n))+[(\log(SR)-\log(TR))*\log(GPD(n))*GF]\}} \quad \text{Equation II}$$

In one embodiment, the gain factor is a constant (C). In another embodiment, the gain factor varies based on the write pulse number. In one embodiment, the gain factor decreases with each increase of the write pulse number (e.g., $GF=C*n^x$, where $x=-\frac{1}{3}, -\frac{1}{2}, -1, -2$, or another suitable value; or GF=

$(1-n^x/C)$, where $x=\frac{1}{3}, \frac{1}{2}, 1, 2$, or another suitable value). A write pulse including a modified gradient portion is applied to the selected phase change element 106 until the sensed resistance is within the predetermined range of the target resistance. In this way, the selected phase change element 106 is programmed to the desired resistance state.

Figure 6:
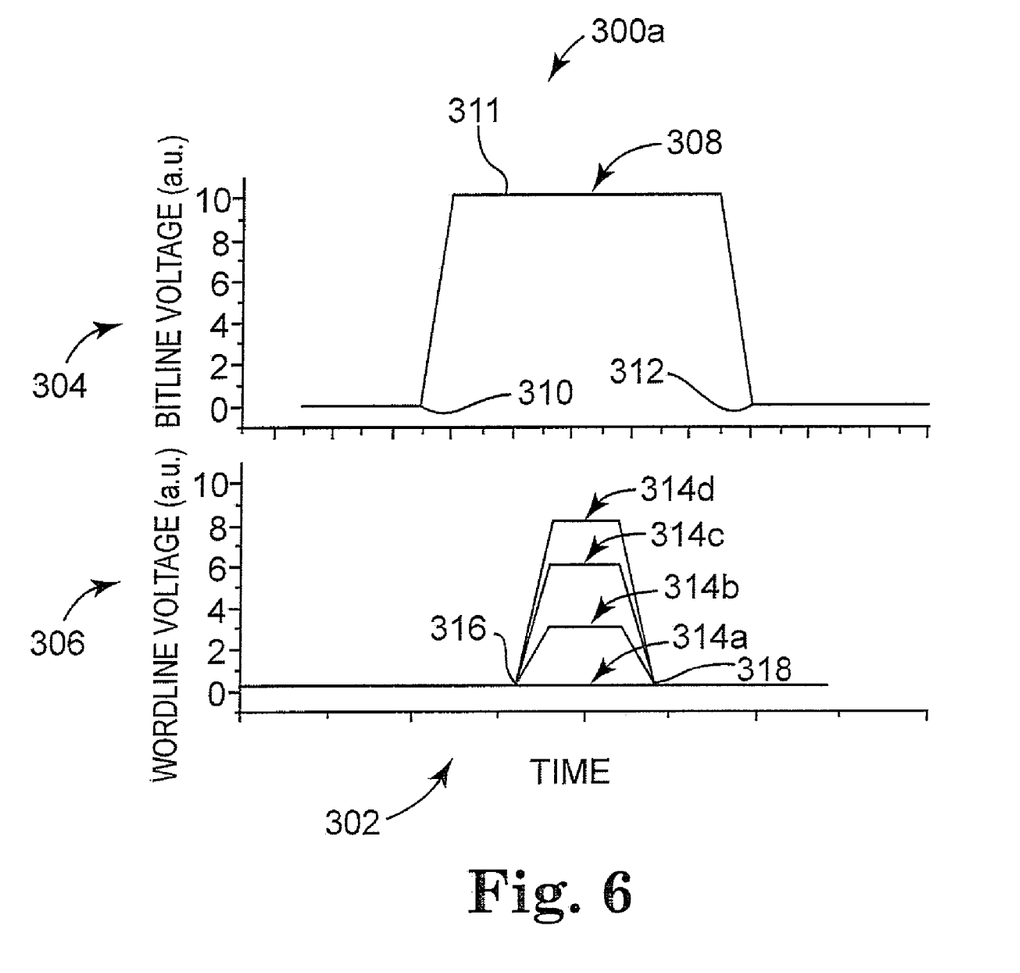
FIG. 6 is a timing diagram illustrating one embodiment of signals for programming a phase change element to a selected one of four resistance states.

FIG. 6 is a timing diagram 300 illustrating one embodiment of signals for programming a selected phase change element 106 to a selected one of four resistance states. In this embodiment, the selected phase change element 106 begins in the fully reset (i.e., amorphous) state. Timing diagram 300 includes time on x-axis 302, bit line voltage on y-axis 304, and word line voltage on y-axis 306.

To program the selected phase change element 106 to one of four resistance states, write circuit 124 precharges the bit line 112 coupled to the selected phase change element 106 as indicated by signal 308. Signal 308 increases from 0V at 310 to a fixed voltage at 311 and decreases back to 0V at 312. With the bit line precharged to the fixed voltage at 311, write circuit 124 provides a selected set voltage pulse on the word line 110 coupled to the gate of the transistor 108, which is coupled to the selected phase change element 106. Each set voltage pulse begins at 316 and ends at 318. Therefore, the selected set voltage pulse defines both the initiation and the termination of the current pulse applied to the selected phase change element 106. In other embodiments, any suitable current or voltage pulses having different amplitudes are applied to the selected phase change element 106 to program the selected phase change element 106 to one of four resistance states.

To program the selected phase change element 106 to the "00" state, such as the state indicated at 200a in FIG. 3, write circuit 124 provides a reset pulse (not shown) and no set voltage pulse as indicated by signal 314a. To program the selected phase change element 106 to the "01" state, such as the state indicated at 200b in FIG. 3, write circuit 124 provides a reset pulse and a set voltage pulse having a first amplitude as indicated by signal 314b. To program the selected phase change element 106 to the "10" state, such as the state indicated at 200c in FIG. 3, write circuit 124 provides a reset pulse and a set voltage pulse having a second amplitude greater than the first amplitude as indicated by signal 314c. To program the selected phase change element 106 to the "11" state, such as the state indicated at 200d in FIG. 3, write circuit 124 provides a reset pulse and a set voltage pulse having a third amplitude greater than the second amplitude as indicated by signal 314d.

The amplitudes of set voltage pulses 314b-314d are best guess amplitudes for programming the selected phase change element 106 to a desired or target resistance. After applying the set voltage pulse having the best guess amplitude to the phase change element for the target resistance, the resistance of the phase change element is sensed and compared to the target resistance. If the sensed resistance is within a predetermined range (e.g., +/−5% on a linear or log scale or other suitable range) of the target resistance, programming of the selected phase change element 106 is complete. If the sensed resistance is not within the predetermined range of the target resistance, the amplitude of the set voltage pulse is modified and the reset pulse and the modified set voltage pulse are again applied to the selected phase change element 106. The amplitude of the set voltage pulse is modified based on the previous amplitude and the difference between the sensed resistance and the target resistance. In one embodiment, the amplitude is modified by applying the following equation:

$$SPA(n+1)=SPA(n)+[(\log(SR)-\log(TR))*SPA(n)*GF] \quad \text{Equation III}$$

where:
SPA=set pulse amplitude;
n=set pulse number;
SR=sensed resistance;
TR=target resistance; and
GF=gain factor.

In another embodiment, the amplitude is modified by applying the following equation including a logarithmic correction:

$$SPA(n+1)=10^{\{\log(SPA(n))+[(\log(SR)-\log(TR))*\log(SPA(n))*GF]\}} \quad \text{Equation IV}$$

In one embodiment, the gain factor is a constant (C). In another embodiment, the gain factor varies based on the set pulse number. In one embodiment, the gain factor decreases with each increase of the set pulse number (e.g., $GF=C*n^x$, where $x=-\frac{1}{3}, -\frac{1}{2}, -1, -2$, or another suitable value; or $GF=(1-n^x/C)$, where $x=\frac{1}{3}, \frac{1}{2}, 1, 2$, or another suitable value). A reset pulse and a set voltage pulse including a modified amplitude are applied to the selected phase change element 106 until the sensed resistance is within the predetermined range of the target resistance. In this way, the selected phase change element 106 is programmed to the desired resistance state.

Figure 7:
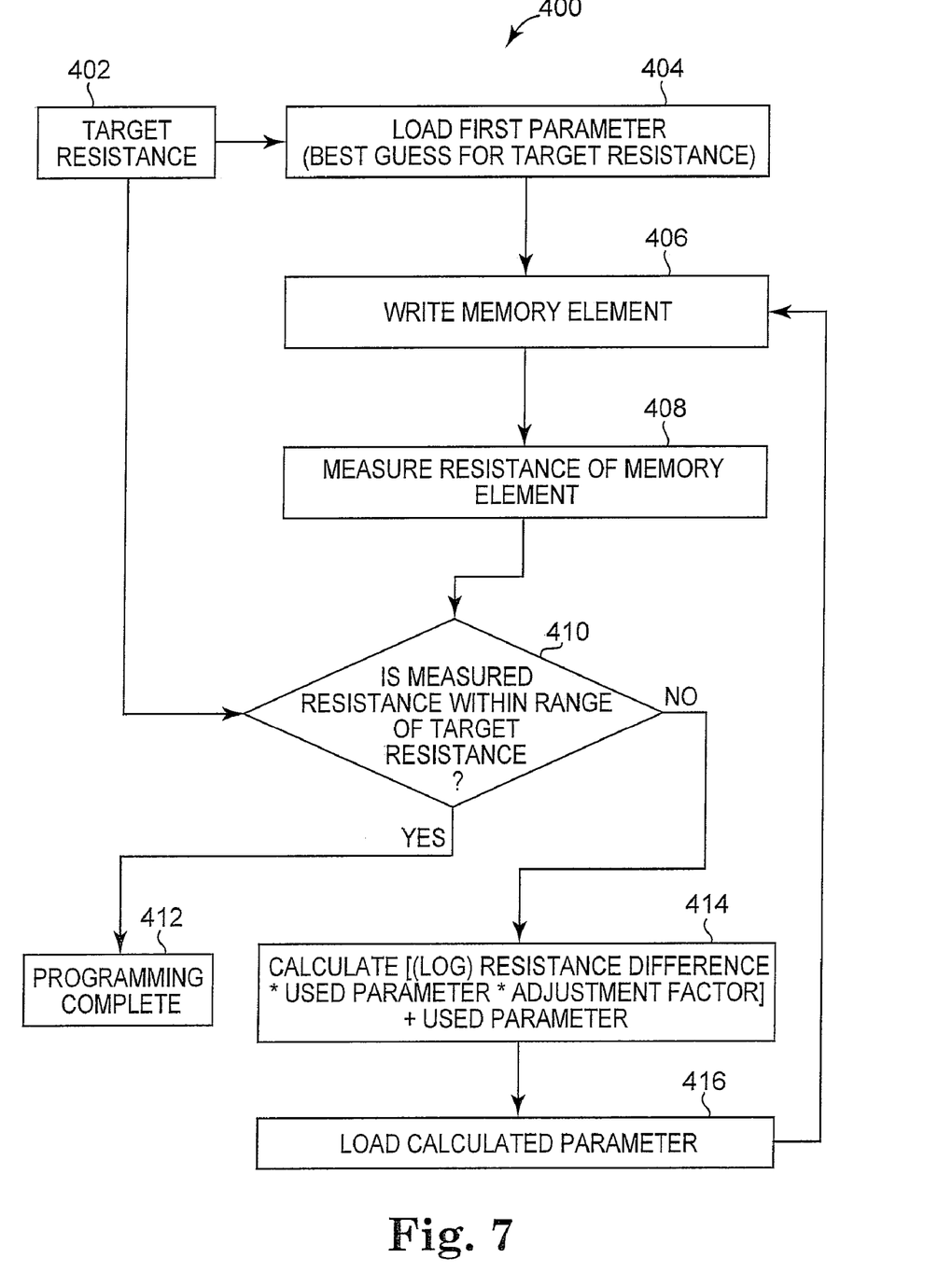
FIG. 7 is a flow diagram illustrating one embodiment of a method for programming a phase change element.

FIG. 7 is a flow diagram illustrating one embodiment of a method 400 for programming a selected phase change element 106. At 402, a target resistance is provided to program a selected phase change element 106 to a selected resistance state. At 404, a write pulse parameter, such as set pulse or pulse tail duration, amplitude, slope, and/or other suitable parameter is loaded. The write pulse parameter is based on the best guess for achieving the target resistance. At 406, a write pulse or pulses including the best guess parameter is applied to the selected phase change element 106. For write pulses providing a direct overwrite, a single write pulse is applied to the selected phase change element 106 to program the selected phase change element 106 to the target resistance. For write pulses not providing a direct overwrite such as amplitude controlled set pulses, two write pulses are applied to the selected phase change element 106. The first write pulse programs the selected phase change element 106 to an initial state and the second write pulse programs the selected phase change element 106 to the target resistance (e.g., a reset pulse and an amplitude controlled set pulse).

At 408, the resistance of the selected phase change element 106 is measured or sensed. In one embodiment, the resistance of the selected phase change element 106 is sensed to determine a range in which the resistance of the selected phase change element 106 falls. At 410, the measured resistance of the selected phase change element 106 is compared to the target resistance. If the measured resistance of the selected phase change element 106 is within a predetermined range (e.g., +/−5% on a linear or log scale or other suitable range) of the target resistance or if the range in which the sensed resistance of the selected phase change element 106 falls is within the same range as the target resistance, programming of the selected phase change element 106 is complete at 412.

If the measured resistance of the selected phase change element 106 is not within the predetermined range of the target resistance or if the range in which the sensed resistance of the selected phase change element 106 falls is not within the same range as the target resistance, a new write pulse parameter is calculated at 414. In one embodiment, the new write pulse parameter is calculated using the following equation:

$$WPP(n+1)=WPP(n)+[(\log(SR)-\log(TR))*WPP(n)*GF] \quad \text{Equation V}$$

where:
WPP=write pulse parameter;
n=write pulse number;
SR=sensed resistance or range in which sensed resistance falls;
TR=target resistance or range in which target resistance falls; and
GF=gain factor.

In another embodiment, the new write pulse parameter is calculated using the following equation including a logarithmic correction:

$$WPP(n+1)=10^{\{log(WPP(n))+[(log(SR)-log(TR))*log(WPP(n))*GF]\}}$$ Equation VI In one embodiment, the gain factor or adjustment factor is a constant (C). In another embodiment, the gain factor varies based on the write pulse number. In one embodiment, the gain factor decreases with each increase of the write pulse number (e.g., $GF=C*n^x$, where $x=-\frac{1}{3}, -\frac{1}{2}, -1, -2$, or other suitable value; or $GF=(1-n^x/C)$, where $x=\frac{1}{3}, \frac{1}{2}, 1, 2$, or another suitable value). At 416, the new write pulse parameter is loaded. At 406, a write pulse including the new modified parameter is applied to the selected phase change element 106. At 408, the resistance of the selected phase change element 106 is again measured and the process repeats until the programming of the selected phase change element 106 is completed at 412.

Figure 8:
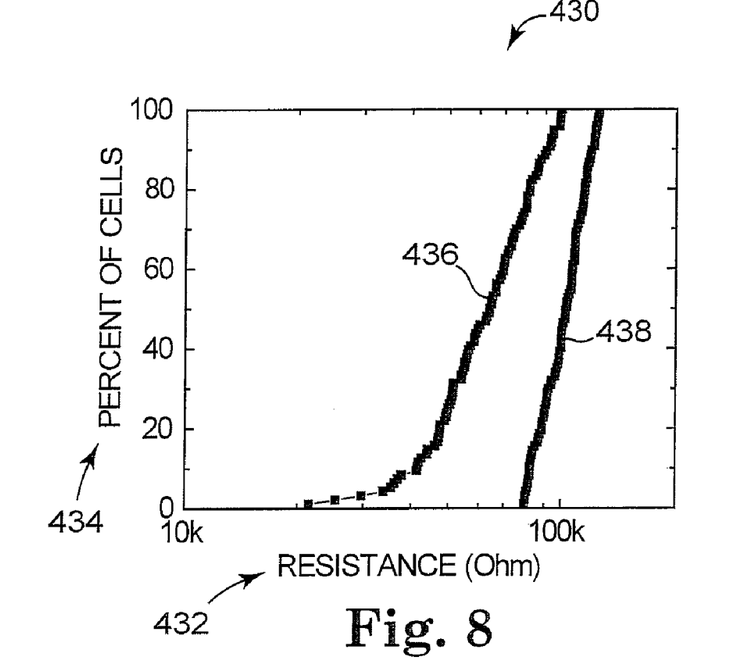
FIG. 8 is a graph illustrating one embodiment of the resistance of phase change elements after programming.

FIG. 8 is a graph 430 illustrating one embodiment of the resistance of phase change elements 106 after programming. Graph 430 includes resistance in Ohms on x-axis 432 and the percent of cells on y-axis 434 for a sample array of phase change elements 106. In this embodiment, a write-verify-write operation is used to achieve a target resistance of 100 kΩ with a target range of +/−5% on the log scale or 56-177 kΩ. In this embodiment, the gain factor is a constant 0.7 and the write pulse parameter value that is modified is pulse tail duration. The best guess initial value for the pulse tail duration is 50 ns to achieve the target resistance of 100 kΩ. The resistance of the phase change elements 106 after a typical write-verify-write operation is indicated at 436. The resistance of the phase change elements 106 using the method previously described and illustrated with reference to FIG. 7 is indicated at 438.

As illustrated in graph 430, the resistance of phase change elements 106 programmed using a typical method, which starts on the low or high side of the target resistance and gradually increases or decreases by a constant value, respectively, typically results in resistance values at the edges of the target range. In addition, overshoot of the target resistance is more likely when phase change elements 106 are programmed using a typical method. In contrast, the resistance of phase change elements 106 programmed using the method previously described and illustrated with reference to FIG. 7 typically results in resistance values within the center of the target range. Overshoot of the target resistance is also not likely to occur when phase change elements 106 are programmed using the method previously described and illustrated with reference to FIG. 7

Figure 9:
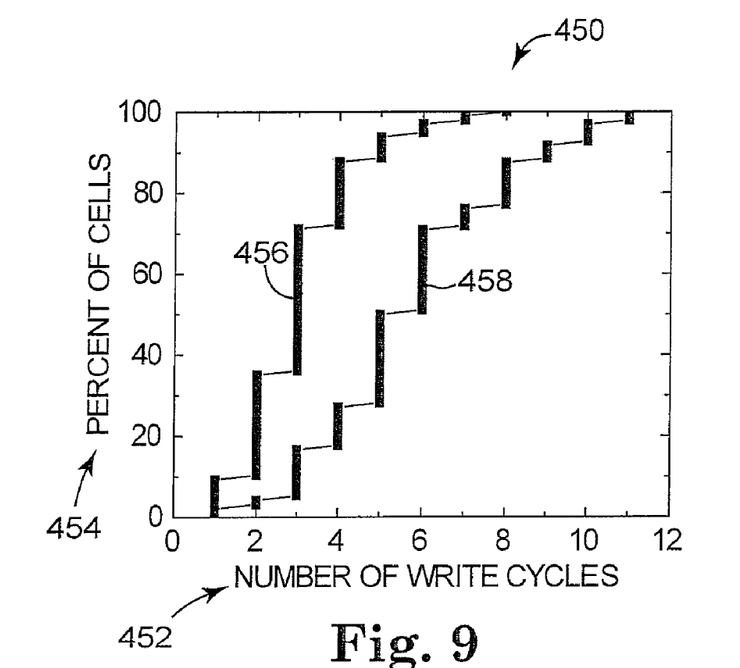
FIG. 9 is a graph illustrating one embodiment of the number of write cycles used to program the phase change elements.

FIG. 9 is a graph 450 illustrating one embodiment of the number of write cycles used to program the phase change elements 106. Graph 450 includes the number of write cycles on x-axis 452 and the percent of cells on y-axis 454 for a sample array of phase change elements 106. The number of write cycles to program the phase change elements 106 using a typical write-verify-write operation is indicated at 458. The number of write cycles to program the phase change elements 106 using the method previously described and illustrated with reference to FIG. 7 is indicated at 456.

As illustrated in graph 450, the number of write cycles used to program the phase change elements 106 using a typical method, which starts on the low or high side of the target resistance and gradually increases or decreases by a constant value, respectively, is up to 11 write cycles. In contrast, the number of write cycles used to program the phase change elements 106 using the method previously described and illustrated with reference to FIG. 7 is up to 8 write cycles. In addition, the majority of the phase change elements 106 are programmed after the first three write cycles using the method previously described and illustrated with reference to FIG. 7 as compared to after six write cycles using the typical method.

Figure 10:
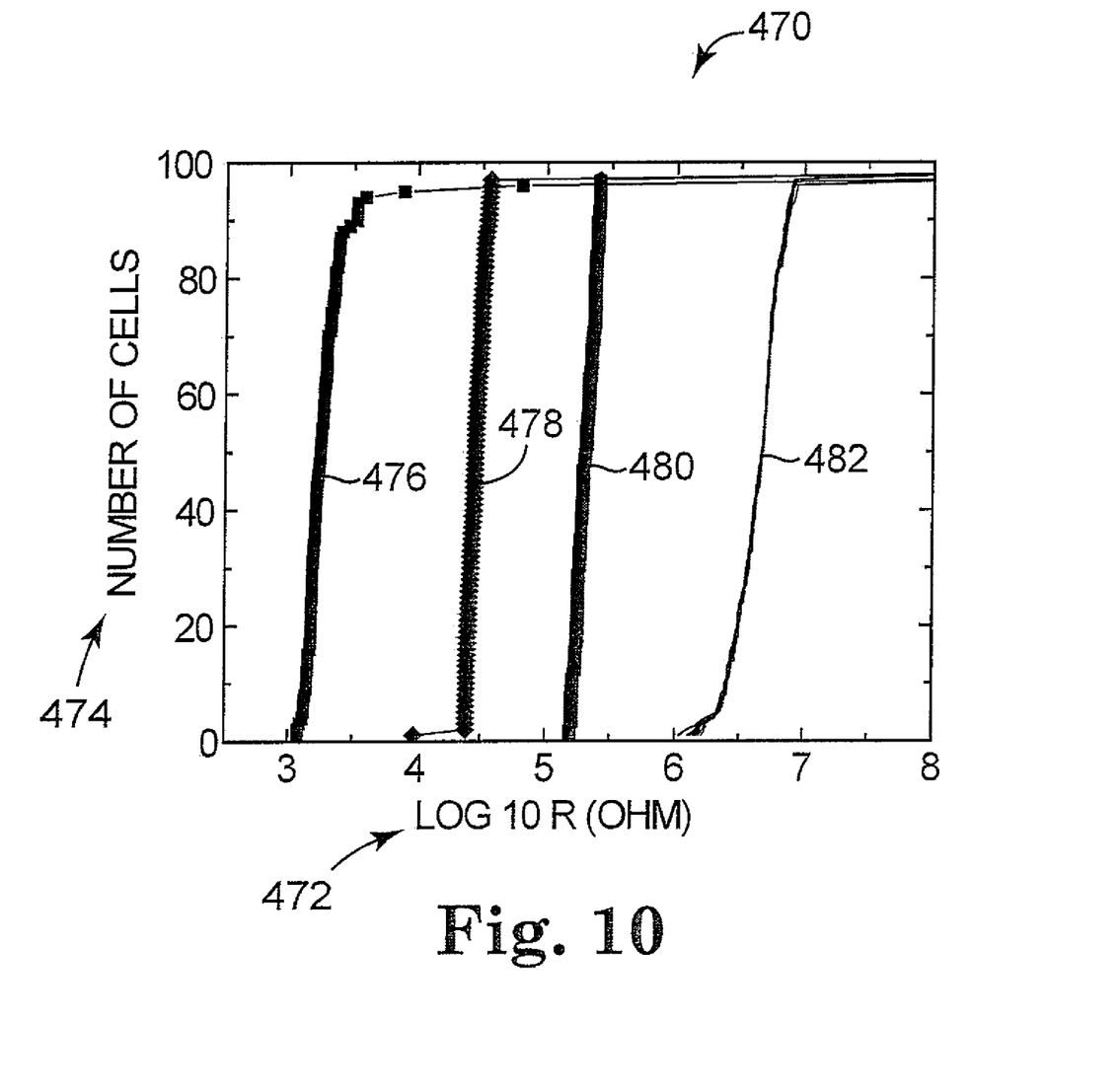
FIG. 10 is a graph illustrating one embodiment of the resistance of phase change elements after programming the phase change elements to one of four resistance states.

FIG. 10 is a graph 470 illustrating one embodiment of the resistance of phase change elements 106 after programming the phase change elements 106 to one of four resistance states using the method previously described and illustrated with reference to FIG. 7. Graph 470 includes the log 10 of resistance (R) in ohms on x-axis 472 and the number of cells on y-axis 474 for a sample array of phase change elements 106. The resistance values for phase change elements 106 programmed to a "11" state, such as the state indicated at 200d in FIG. 3, are indicated at 476. The resistance values for phase change elements 106 programmed to a "10" state, such as the state indicated at 200c in FIG. 3, are indicated at 478. The resistance values for phase change elements 106 programmed to a "01" state, such as the state indicated at 200b in FIG. 3, are indicated at 480. The resistance values for phase change elements 106 programmed to a "00" state, such as the state indicated at 200a in FIG. 3, are indicated at 482. The distributions of the resistance values are narrow and separated from each other, such that four distinct resistance levels are reliably achieved.

Embodiments provide a method for programming memory elements to a target resistance. A best guess parameter value for achieving the target resistance is selected to provide an initial write pulse to a selected memory element. The selected memory element is programmed by applying one or more pulses to the memory element until a sensed resistance of the memory element is within a range of the target resistance. The parameter value of the one or more pulses is modified for each subsequent pulse based on the parameter value for the immediately preceding pulse and on a difference between the sensed resistance of the memory element and the target resistance. The method reduces the time used to program the memory elements and increases the precision of the programmed resistance compared to typical programming methods.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a memory element; and
   a circuit configured to program the memory element by applying one or more pulses to the memory element until a sensed resistance of the memory element is within a range of a desired resistance, the one or more pulses having a parameter value that is modified for each subsequent pulse based on the parameter value for an immediately preceding pulse and on a difference between the sensed resistance of the memory element and the desired resistance.

2. The integrated circuit of claim 1, wherein the parameter value (PV) is modified for each subsequent pulse (n+1) by: PV(n+1)=PV(n)+[(log(sensed resistance)−log(desired resistance))*PV(n)*(a gain factor)], where n equals a pulse number for the immediately preceding pulse.

3. The integrated circuit of claim 2, wherein the gain factor is a constant.

4. The integrated circuit of claim 2, wherein the gain factor is based on the pulse number.

5. The integrated circuit of claim 1, wherein the parameter value (PV) is modified for each subsequent pulse (n+1) by: $PV(n+1)=10^{\{log(PV(n))+[(log(sensed\ resistance)-log(desired\ resistance))*log(PV(n))*(a\ gain\ factor)]\}}$, where n equals a pulse number for the immediately preceding pulse.

6. The integrated circuit of claim 5, wherein the gain factor is a constant.

7. The integrated circuit of claim 5, wherein the gain factor is based on the pulse number.

8. The integrated circuit of claim 1, wherein the parameter value for an initial pulse comprises a best guess for achieving the desired resistance.

9. The integrated circuit of claim 1, wherein the parameter value comprises a pulse duration.

10. The integrated circuit of claim 1, wherein the parameter value comprises a pulse amplitude.

11. The integrated circuit of claim 1, wherein the parameter value comprises a pulse tail portion slope.

12. The integrated circuit of claim 1, wherein the memory element is configured to be programmed to any one of at least three resistance states.

13. The integrated circuit of claim 1, wherein the memory element comprises a phase change element.

14. A system comprising:
a host; and
a memory device communicatively coupled to the host, the memory device comprising:
a memory element configured to be programmed to any one of at least three resistances; and
a circuit configured to program the memory element to a target resistance by:
applying a first pulse to the memory element, the first pulse including a first portion corresponding to the target resistance;
sensing a resistance of the memory element;
comparing the sensed resistance to the target resistance; and
applying a second pulse to the memory element in response to the comparison indicating that the sensed resistance is not within a range of the target resistance, the second pulse including a second portion that is modified from the first portion by a value proportional to a difference between the sensed resistance and the target resistance.

15. The system of claim 14, wherein the second portion is modified from the first portion by a value proportional to a difference between a log of the sensed resistance and a log of the target resistance times a gain factor.

16. The system of claim 15, wherein the gain factor is a constant.

17. The system of claim 15, wherein the gain factor decreases for each pulse applied to the memory element.

18. The system of claim 14, wherein one of a duration, an amplitude, and a slope of the second portion is modified from the first portion.

19. A memory comprising:
a multi-bit phase change element; and
means for programming the phase change element to a desired resistance by:
applying a first pulse to the phase change element, the first pulse including a first tail portion corresponding to the desired resistance;
determining a resistance of the phase change element;
comparing the determined resistance to the desired resistance; and
applying a second pulse to the phase change element in response to the comparison indicating that the determined resistance is not within a range of the desired resistance, the second pulse including a second tail portion that is modified from the first tail portion by a value proportional to a difference between a log of the determined resistance and a log of the desired resistance.

20. The memory of claim 19, wherein applying the second pulse comprises applying the second pulse in response to the comparison indicating that the determined resistance is not within a range of +/−5% on a linear or log scale of the desired resistance.

21. A method for programming a memory element, the method comprising:
applying one or more pulses to a memory element until a sensed resistance of the memory element is within a range of a desired resistance, the one or more pulses having a parameter value that is modified for each subsequent pulse based on the parameter value for an immediately preceding pulse and on a difference between the sensed resistance of the memory element and the desired resistance.

22. The method of claim 21, wherein the parameter value (PV) is modified for each subsequent pulse (n+1) by: PV(n+1)=PV(n)+[(log(sensed resistance)−log(desired resistance))*PV(n)*(a gain factor)], where n equals a pulse number for the immediately preceding pulse.

23. The method of claim 22, further comprising:
setting the gain factor to a constant.

24. The method of claim 22, further comprising:
setting the gain factor based on the pulse number.

25. The method of claim 21, wherein the parameter value (PV) is modified for each subsequent pulse (n+1) by: $PV(n+1)=10^{\{log(PV(n))+[(log(sensed\ resistance)-log(desired\ resistance))*log(PV(n))*(a\ gain\ factor)]\}}$, where n equals a pulse number for the immediately preceding pulse.

26. The method of claim 25, further comprising:
setting the gain factor to a constant.

27. The method of claim 25, further comprising:
setting the gain factor based on the pulse number.

28. The method of claim 21, further comprising:
setting the parameter value for an initial pulse to a best guess value for achieving the desired resistance.

29. The method of claim 21, wherein applying the one or more pulses comprises applying the one or more pulses having a parameter value comprising one of a pulse duration, a pulse amplitude, and a pulse tail portion slope that is modified for each subsequent pulse.

30. The method of claim 21, wherein applying the one or more pulses comprises applying the one or more pulses to a memory element configured to be programmed to any one of at least three resistance states.

31. The method of claim 21, wherein applying the one or more pulses to the memory element comprises applying the one or more pulses to a phase change element.

32. A method for programming a phase change element, the method comprising:

applying a first pulse to a phase change element, the first pulse including a first portion corresponding to a target resistance, sensing a resistance of the phase change element;

comparing the sensed resistance to the target resistance; and applying a second pulse to the phase change element in response to the comparison indicating that the sensed resistance is not within a range of the target resistance, the second pulse including a second portion that is modified from the first portion by a value proportional to a difference between a log of the sensed resistance and a log of the target resistance.

33. The method of claim 32, wherein applying the second pulse comprises applying the second pulse including a second portion that has a modified duration from the first portion.

34. The method of claim 32, wherein applying the second pulse comprises applying the second pulse including a second portion that has a modified amplitude from the first portion.

35. The method of claim 32, wherein applying the second pulse comprises applying the second pulse including a second portion that has a modified slope from the first portion.

* * * * *